United States Patent
Kaneko et al.

(10) Patent No.: US 11,004,652 B2
(45) Date of Patent: May 11, 2021

(54) ION MILLING DEVICE

(71) Applicant: Hitachi High-Technologies Corporation, Tokyo (JP)

(72) Inventors: Asako Kaneko, Tokyo (JP); Hisayuki Takasu, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/642,231

(22) PCT Filed: Sep. 15, 2017

(86) PCT No.: PCT/JP2017/033428
§ 371 (c)(1),
(2) Date: Feb. 26, 2020

(87) PCT Pub. No.: WO2019/053871
PCT Pub. Date: Mar. 21, 2019

(65) Prior Publication Data
US 2020/0357602 A1    Nov. 12, 2020

(51) Int. Cl.
*H01J 37/20*    (2006.01)
*H01J 37/28*    (2006.01)
(Continued)

(52) U.S. Cl.
CPC ............. *H01J 37/20* (2013.01); *H01J 37/08* (2013.01); *H01J 37/09* (2013.01); *H01J 37/28* (2013.01);
(Continued)

(58) Field of Classification Search
CPC .. H01J 37/20; H01J 37/08; H01J 37/09; H01J 37/28; H01J 37/31; H01J 2237/081; H01J 2237/20257
(Continued)

(56) References Cited

U.S. PATENT DOCUMENTS 4,959,543 A  *  9/1990  McIver, Jr. ........... H01J 49/022
                                                         250/282
5,977,553 A     11/1999  Oh et al.
(Continued)

FOREIGN PATENT DOCUMENTS

JP        3-36285 A     2/1991
JP     10-269984 A    10/1998
(Continued)

OTHER PUBLICATIONS

International Search Report (PCT/ISA/210) issued in PCT Application No. PCT/JP2017/033428 dated Nov. 21, 2017 with English translation (two (2) pages).
(Continued)

*Primary Examiner* — Nicole M Ippolito
(74) *Attorney, Agent, or Firm* — Crowell & Moring LLP

(57) ABSTRACT

An object of the present invention is to provide a technique for reducing a phenomenon in which fine particles derived from a sample and bounced off by ion beam irradiation are reattached to an ion milling surface. An ion milling device of the invention includes an ion source which emits an ion beam, a chamber, a sample table in which a sample is placed in the chamber, and a shielding plate placed on the sample, and by having a magnet disposed in the chamber, reattachment of fine particles derived from the sample can be reduced.

9 Claims, 5 Drawing Sheets

(51) Int. Cl.
*H01J 37/08* (2006.01)
*H01J 37/09* (2006.01)
*H01J 37/31* (2006.01)

(52) U.S. Cl.
CPC ......... *H01J 37/31* (2013.01); *H01J 2237/081* (2013.01); *H01J 2237/20257* (2013.01)

(58) Field of Classification Search
USPC ... 250/492.1, 492.2, 492.21, 492.22, 492.23, 250/492.3
See application file for complete search history.

(56) References Cited

U.S. PATENT DOCUMENTS

| | | | | |
|---|---|---|---|---|
| 6,259,174 B1 * | 7/2001 | Ono | ................... | G03F 7/70758 310/13 |
| 6,437,864 B1 * | 8/2002 | Watanabe | ........... | G03F 7/70716 355/53 |
| 6,730,916 B1 * | 5/2004 | Tsuji | ....................... | H01J 37/09 250/442.11 |
| 8,803,513 B2 * | 8/2014 | Hosek | .................... | G01B 7/003 324/207.24 |
| 2015/0008121 A1 | 1/2015 | Kamino et al. | | |

FOREIGN PATENT DOCUMENTS

| | | |
|---|---|---|
| JP | 2009-74933 A | 4/2009 |
| JP | 2010-169459 A | 8/2010 |
| JP | 2013-201028 A | 10/2013 |
| JP | 2016-173874 A | 9/2016 |

OTHER PUBLICATIONS

Japanese-language Written Opinion (PCT/ISA/237) issued in PCT Application No. PCT/JP2017/033428 dated Nov. 21, 2017 (five (5) pages).

* cited by examiner

[FIG. 1]
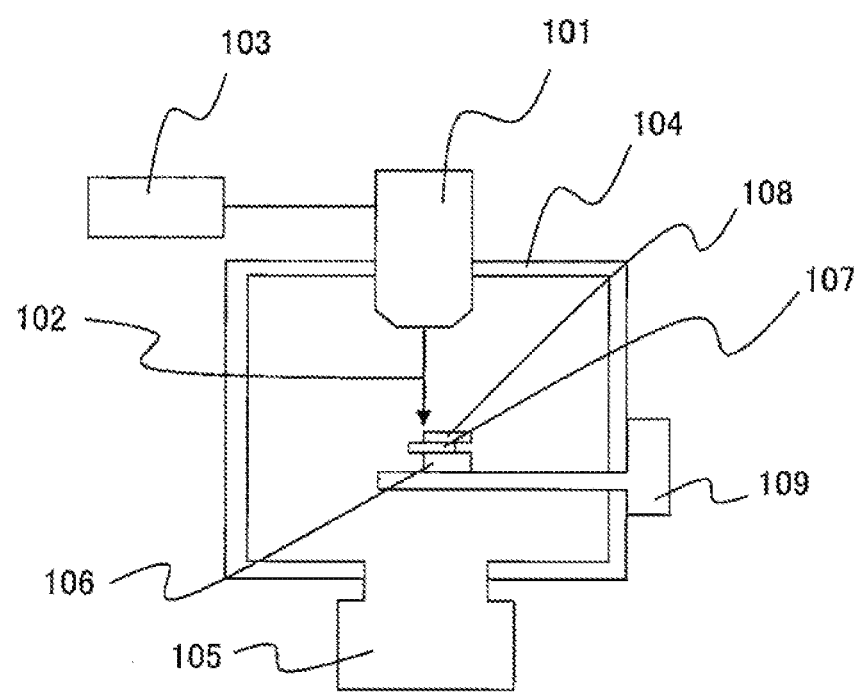

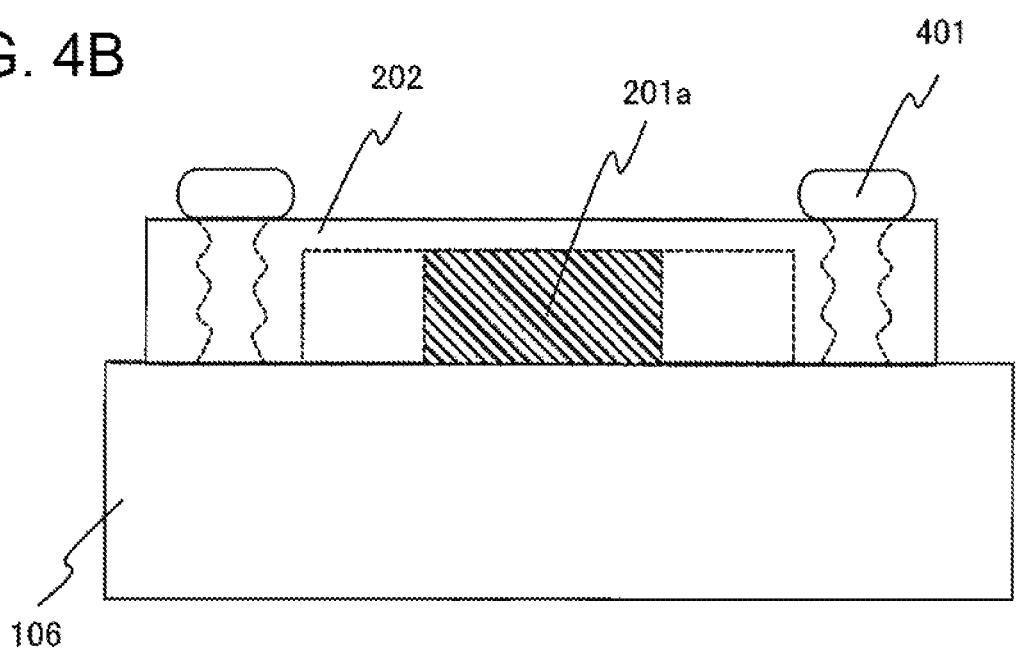

ION MILLING DEVICE

TECHNICAL FIELD

The present invention relates to an ion milling device.

BACKGROUND ART

An ion milling device is a device which cuts the cross section and surface of a sample by utilizing a sputtering phenomenon in which an ion beam having a uniform energy and direction is accelerated to irradiate the sample and the sample atoms are blown off from the sample surface. The ion milling device is used in a wide range of fields as a sample pretreatment device of, for example, a scanning electron microscope (SEM). As described in PTL 1, there are generally a plane milling method and a cross-section milling method. The former planar milling method is a method of directly irradiating a sample surface with an ion beam to cut the sample and has a feature that a wide range of the sample can be cut as described in PTL 2. On the other hand, in the latter cross-section milling, in order to prevent sample damage other than the processing target position due to ion beam scattering during sample processing, a shielding plate can be disposed on the upper surface of the sample other than the processing target position and the cross section of the sample protruding from an end surface of the shielding plate by several µm to 200 µm can be processed smoothly along the end surface of the shielding plate. In this case, the phenomenon that the molecules of the sputtered sample are reattached to a processed surface of the sample occurs, and when sputtered particles adhere to an observation and analysis target part, it becomes an adverse effect of observation when the processed surface is observed with an SEM or the like. Here, as a countermeasure for reducing the phenomenon that sputtered particles are reattached to the processed surface, there is a method of providing a contamination trap using a cooling mechanism disclosed in PTL 3.

CITATION LIST

Patent Literature

PTL 1: JP-A-2013-201028
PTL 2: JP-A-1991-36285
PTL 3: JP-A-2016-173874

SUMMARY OF INVENTION

Technical Problem

In cross-section milling, there is a problem that fine particles derived from a sample and sputtered by ion beam irradiation reattach to the ion milling surface and this makes it difficult to observe the ion milling surface with a scanning electron microscope (SEM) or the like. The technique using the contamination trap disclosed in PTL 3 is not an effective method in a case of processing that does not require sample cooling.

An object of the invention is to provide a technique for reducing a phenomenon in which fine particles derived from a sample and bounced off by ion beam irradiation are reattached to an ion milling surface.

Solution to Problem

In an ion milling device of the invention, an ion source which emits an ion beam, a chamber, a sample table on which a sample is placed in the chamber, a shielding plate placed on the sample, and a magnet disposed in the chamber are provided, and therefore the problem described above is solved.

Advantageous Effects of Invention

According to the invention, the phenomenon that fine particles derived from a sample and bounced off by ion beam irradiation reattach to an ion milling surface can be reduced, so that a sample processed to have a favorable ion milling surface can be observed with a scanning electron microscope (SEM) or the like.

BRIEF DESCRIPTION OF DRAWINGS

FIG. 1 is a configuration diagram of a general ion milling device.
FIG. 4B is a side view of the sample table using the permanent magnet.

DESCRIPTION OF EMBODIMENTS

Example 1

Figure 2A:
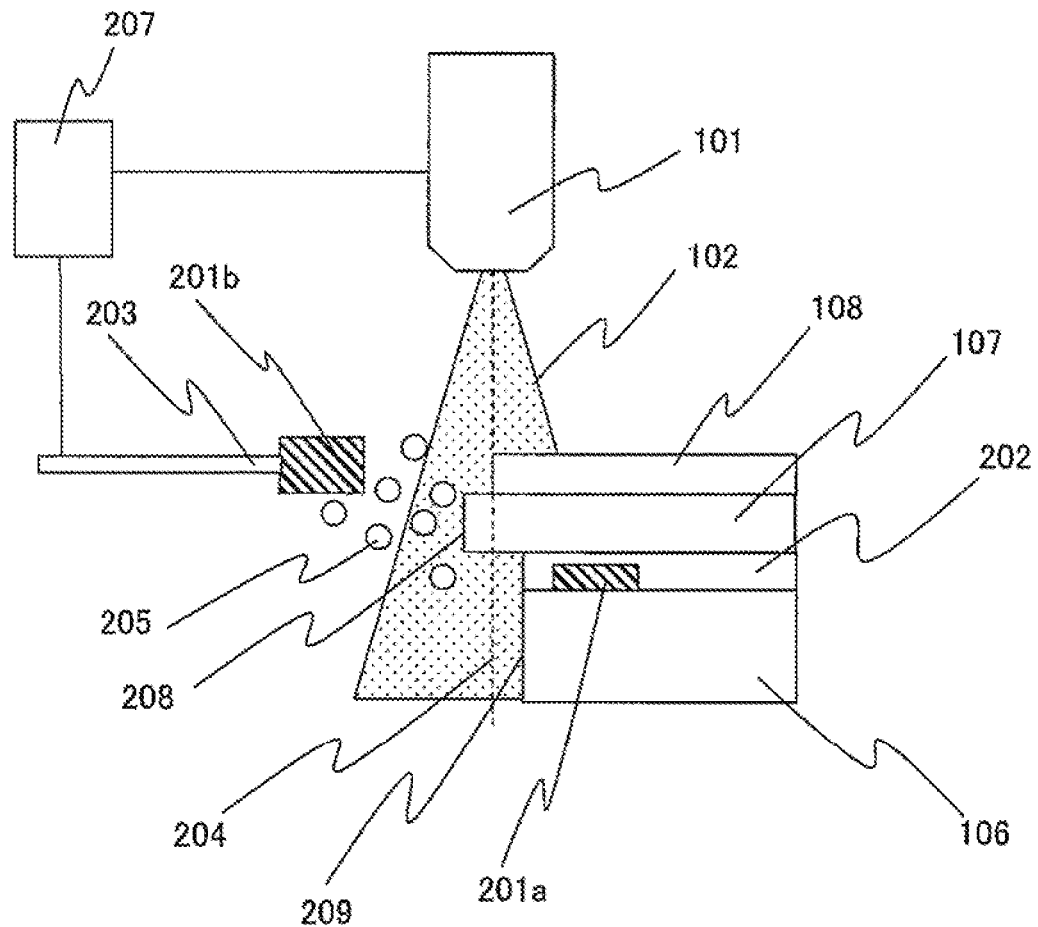
FIG. 2A is a schematic view of an ion milling device using a permanent magnet.

FIG. 1 is a view illustrating a configuration of an ion milling device in which a shielding plate 108 is installed on an upper surface of a sample 107 and the sample 107 is irradiated with an ion beam 102 accelerated from an ion source 101, and then the cross section of a protruding portion of the sample 107 is processed using an ion sputtering phenomenon. The current density of argon ions in the argon ion source 101 is controlled by an ion source control unit 103. A vacuum exhaust system 105 can be controlled so that the inside of a vacuum chamber 104 can be in a vacuum or atmospheric state and this state can be maintained.

The sample 107 is fixed on a sample table 106 arranged in the vacuum chamber 104. Further, a sample stage 109 can be pulled out of the vacuum chamber 104 when the inside of the vacuum chamber 104 is opened to the atmosphere. The sample table 106 on which the sample 107 is fixed can be fixed on the sample table 109. A portion protruding from the shielding plate 108 of the sample 107 can be processed by fixing the shielding plate 108 on the sample 107 and being irradiated with the ion beam 102 emitted from the ion source 101.

In FIG. 2(a), a permanent magnet 201a is installed as a suitable example of a magnet between the upper surface of the sample table 106 made of a non-magnetic material and a cavity in a magnet holding plate 202 made of the non-magnetic material and the sample 107 is disposed on the upper surface of the magnet holding plate 202, and further the shielding plate 108 is disposed on the upper surface of the sample 107 at a position where the sample 107 protrudes. As the non-magnetic material used for the sample table 106, austenitic stainless steel, high manganese steel, high nickel alloy, aluminum, copper, or the like can be used.

The permanent magnet 201a is detachable from the sample table 106 and it can be used by fixing the sample 107 to the upper surface of the magnet holding plate 202 with the permanent magnet 201a removed. Alternatively, it can be used by removing the permanent magnet 201a and the magnet pressing plate 202 and directly fixing the sample 107 to the upper surface of the sample table 106. Further, the permanent magnet may be mounted on a holder so that it can be detached.

In particular, when a sample end surface 208 protrudes from the sample table 106 by several millimeters and is fixed to the sample table 106, the permanent magnet 201a is preferably fixed close to a sample table end surface 209 of the sample table 106. However, it is not always necessary to bring the permanent magnet 201a close to the sample table end surface 209 of the sample table 106 depending on the processing conditions such as the size and shape of the sample and the acceleration voltage.

On a lateral side of the sample 107, a permanent magnet 201b fixed to a magnet support portion 203 is disposed. The arrangement position of the permanent magnet 201b can be adjusted by a control unit 207 via the magnet support portion 203 according to the irradiation position of the ion beam 102, the intensity of the ion beam 102, the size of the sample 107, and the processing position. By adjusting the position of the magnet support portion 203, processing according to the sample can be performed without the ion beam 102 hitting the permanent magnet 201b. The shape of the permanent magnet 201b is not particularly specified in shape, such as a cylinder, or a cube or size, but it is desirable to use one having a maximum magnetic force of about 300 gauss to 400 gauss. However, it is also possible to use a permanent magnet with a maximum magnetic force outside the range of 300 gauss to 400 gauss depending on the material, size or processing position of the sample.

Figure 2B:
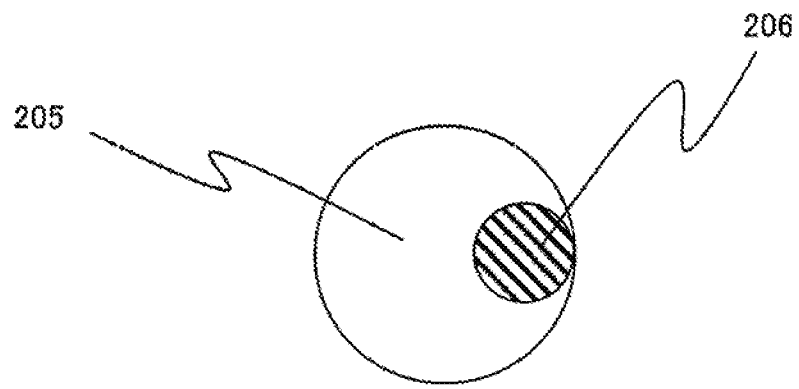
FIG. 2B is a schematic view of a fine particle sputtered from a sample.

The ion beam 102 irradiated from the ion source 101 spreads at a constant angle from an ion beam center 204, so that the ion density at the center of the ion beam becomes higher. When the ion beam 102 is incident on the sample 107 protruding from the shielding plate 108, sample fine particles 205 of the sample sputtered out from the sample surface jump out. Here, FIG. 2(b) illustrates a schematic view of the sample fine particle 205 of the sample sputtered from the sample surface. The sample fine particles 205 of the sample sputtered and bounced off by the ion beam 102 are implanted with ions, that is, argon ions 206, irradiated with the ion beam 102, and thus the sample fine particles 205 have a positive charge as a whole.

When the sample fine particle 205 of the sample sputtered from the sample is particularly a magnetic material, the sample fine particles 205 of the sample sputtered from the sample 107 are attracted to the magnetic force of the permanent magnet 201a arranged on the upper portion of the sample table 106, and thus the phenomenon that the sample fine particles 205 of the sample sputtered from the sample are reattached to the processed surface of the sample 107 can be reduced.

In addition, the permanent magnet 201b fixed to the magnet support portion 203 is arranged on the lateral side of the sample processing surface. Therefore, similar to the effect of the permanent magnet 201a, the sample fine particle 205 of the sample sputtered from the sample 107 is attracted to the permanent magnet 201b, and thus the phenomenon that the sample fine particles 205 of the sample sputtered from the sample 107 are reattached to the sample processing surface can be reduced.

Furthermore, not only on the sample processing surface, but also on samples where there are voids, cracks, plating defects, foreign matter, or a space derived from a laminated structure, the sample fine particles 205 of the sample sputtered from the sample 107 can be reattached to the space. However, by either one of the permanent magnet 201a and the permanent magnet 201b or a combination of both, it is possible to reduce the phenomenon that the sputtered sample fine particles 205 of the sample are reattached to the space of the sample 107. Therefore, the sample 107 is moved to the scanning electron microscope (SEM) while being placed on the sample table 106 and the processed surface of the sample 107 can be clearly observed using the scanning electron microscope (SEM) or the like. Further, since there is a concern about the influence on an electron beam due to the magnetic force of the permanent magnet 201a during the SEM observation, the influence on the electron beam is reduced by removing the permanent magnet 201a, thereby enabling effective SEM observation.

Figure 3A:
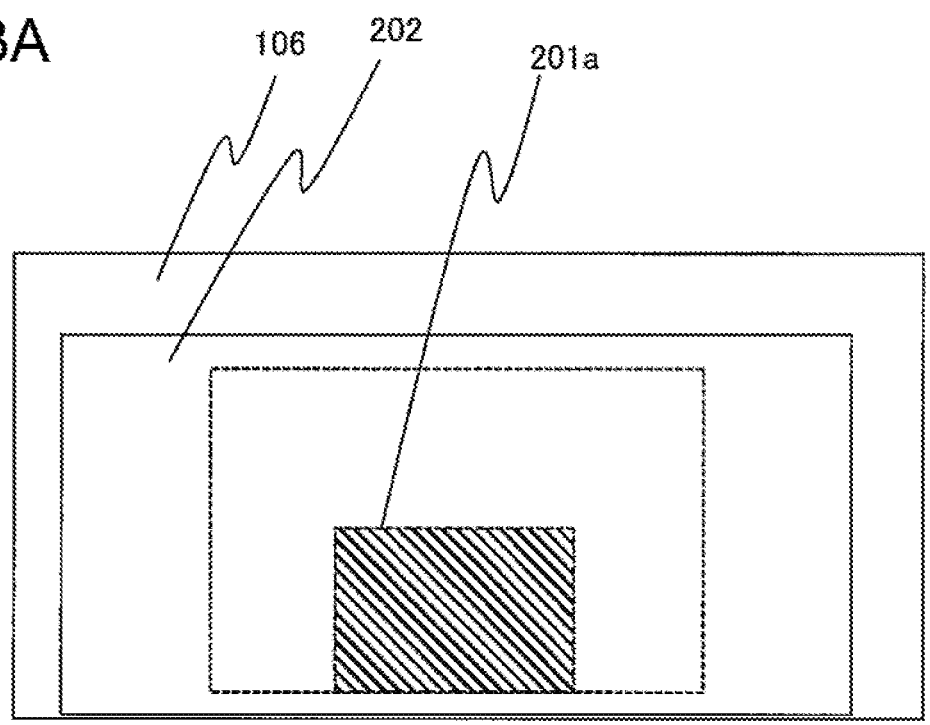
FIG. 3A is a top view of a sample table using a permanent magnet.
Figure 3B:
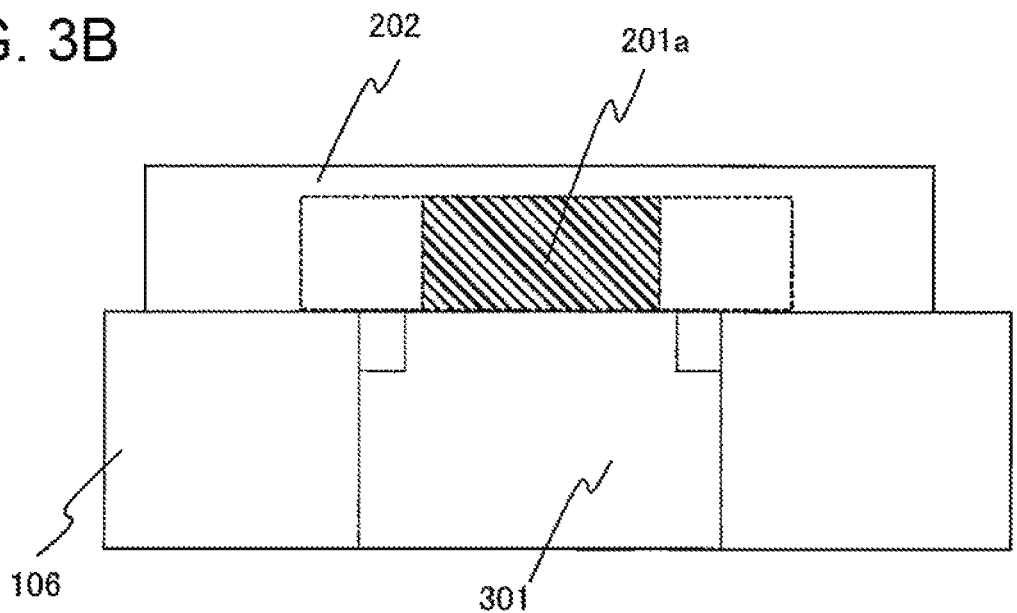
FIG. 3B is a side view of the sample table using the permanent magnet.

FIG. 3(a) is a top view of a sample table using a permanent magnet and FIG. 3(b) is a side view of the sample table using the permanent magnet. A magnet holding plate 202 made of a non-magnetic material is arranged on the upper surface of the sample table 106 made of a non-magnetic material and the magnet holding plate 202 has a cavity of a circle or rectangle shape, for example, inside, and further the permanent magnet 201a is held in the cavity by a magnet holder 301 made of a non-magnetic material. At the time of SEM observation, there is a concern about the influence of the magnetic force of the permanent magnet 201a on the electron beam. Therefore, by removing the magnet holder 301 from the sample table 106, the permanent magnet 201a is removed from below the sample table 106. Therefore, the influence on the electron beam is reduced and it is possible to perform the effective SEM observation. The shape of the permanent magnet 201a is not particularly specified in shape, such as a cylinder or a cube, or size, but it is desirable to use a permanent magnet having a maximum magnetic force of about 300 gauss to 400 gauss.

However, it is also possible to use a permanent magnet with a maximum magnetic force outside the range of 300 gauss to 400 gauss depending on the material, size, or processing position of the sample. It is possible to mount the permanent magnet 201a of which the size is also changed according to the material, size, or processing position of the sample. Further, the permanent magnet 201a is fixed inside the magnet holding plate 202 by making it in contact with the magnet holding plate 202 and the magnet holder 301. However, in the cavity inside the magnet holding plate 202, the fixing position of the permanent magnet 201a can be freely changed.

Figure 4A:
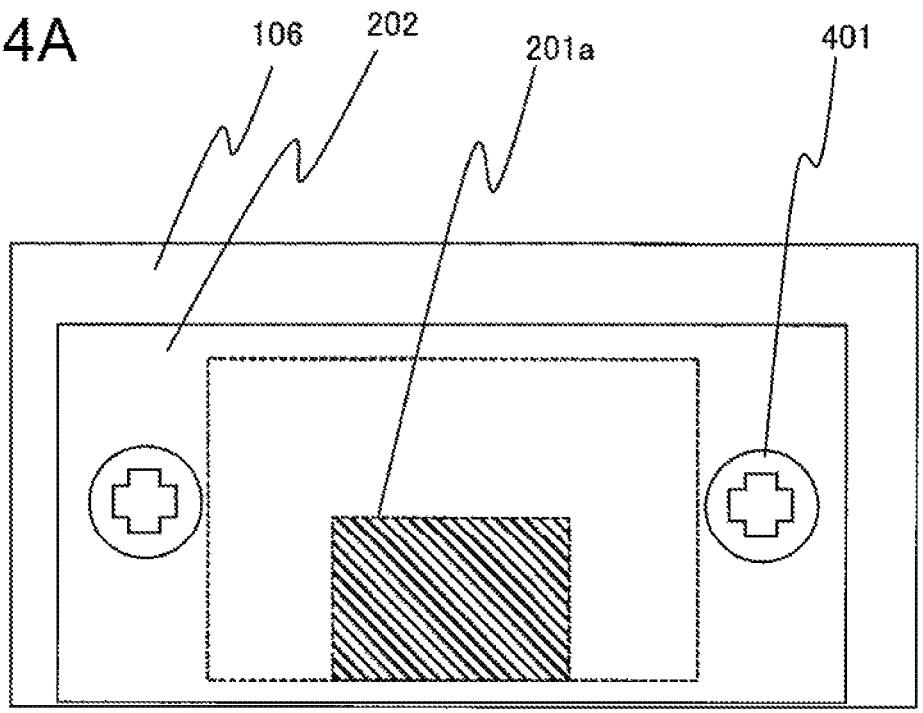
FIG. 4A is a top view of a sample table using a permanent magnet.

FIG. 4(a) is a top view of a sample table using a permanent magnet and FIG. 4(b) is a side view of the sample table using the permanent magnet. The magnet holding plate 202 is arranged on the upper surface of the sample table 106 made of a non-magnetic material and the permanent magnet 201a can be arranged on the sample table 106 by fixing with a screw 401.

REFERENCE SIGNS LIST

101: ion source
102: ion beam
103: ion source control unit
104: vacuum chamber
105: vacuum exhaust system
106: sample table 107: sample
108: shielding plate
109: sample stage
201a: permanent magnet
201b: permanent magnet
202: magnet holding plate
203: magnet support portion
204: ion beam center
205: sample fine particle
206: argon ion
207: control unit
208: sample end surface
209: sample table end surface
301: magnet holder
401: screw

The invention claimed is:

1. An ion milling device, comprising:
a chamber;
a sample table made of a non-magnetic material and on which a sample is placed in the chamber;
a shielding plate placed on the sample; and
an ion source which is placed so as to face an upper surface of the sample table and emits an ion beam, wherein
a magnet holding plate made of a non-magnetic material in which a first magnet is detachably disposed on the upper surface of the sample table and the sample is placed on an upper surface of the magnet holding plate when the first magnet is disposed on the sample table.

2. The ion milling device according to claim 1, wherein a second magnet is disposed on a lateral side of the sample.

3. The ion milling device according to claim 2, wherein the first magnet is disposed on the sample table and the second magnet is disposed on the lateral side of the sample.

4. The ion milling device according to claim 1, comprising
a holder for detachably holding the first magnet.

5. The ion milling device according to claim 2, comprising:
a moving mechanism for the second magnet.

6. The ion milling device according to claim 1, wherein the first magnet is a permanent magnet.

7. The ion milling device according to claim 6, wherein the permanent magnet has a maximum magnetic force of about 300 gauss to 400 gauss.

8. The ion milling device according to claim 1, wherein the magnet holding plate has a cavity, and
an arrangement position of the first magnet can be adjusted in the cavity of the magnet holding plate.

9. The ion milling device according to claim 1, wherein the sample table has a magnet holder, and
the first magnet can be removed from below the sample table by removing the magnet holder of the sample table.

* * * * *